US012580013B2

(12) United States Patent
Yasuda et al.

(10) Patent No.: US 12,580,013 B2
(45) Date of Patent: Mar. 17, 2026

(54) MEMORY SYSTEM INCLUDING CURRENT COPY CIRCUIT CONFIGURED TO COPY CURRENT

(71) Applicant: Kioxia Corporation, Tokyo (JP)

(72) Inventors: Takaya Yasuda, Kawasaki Kanagawa (JP); Kosuke Hatsuda, Tokyo (JP)

(73) Assignee: Kioxia Corporation, Tokyo (JP)

( * ) Notice: Subject to any disclaimer, the term of this patent is extended or adjusted under 35 U.S.C. 154(b) by 94 days.

(21) Appl. No.: 18/594,104

(22) Filed: Mar. 4, 2024

(65) Prior Publication Data

US 2024/0304229 A1    Sep. 12, 2024

(30) Foreign Application Priority Data

Mar. 8, 2023    (JP) ................................. 2023-035457

(51) Int. Cl.
*G11C 11/16* (2006.01)

(52) U.S. Cl.
CPC ...... *G11C 11/1675* (2013.01); *G11C 11/1697* (2013.01)

(58) Field of Classification Search
CPC ........................ G11C 11/1697; G11C 11/1675
USPC ....................................................... 365/158
See application file for complete search history.

(56) References Cited

U.S. PATENT DOCUMENTS

| 8,982,603 | B2 * | 3/2015 | Azuma .............. | G11C 13/0028 |
| | | | | 365/158 |
| 10,360,976 | B2 | 7/2019 | Katayama | |
| 10,475,510 | B2 | 11/2019 | Yang et al. | |
| 10,685,707 | B2 * | 6/2020 | Gangasani ......... | G11C 13/0023 |
| 2017/0103788 | A1 * | 4/2017 | Levisse .................. | H10B 61/00 |
| 2018/0204615 | A1 * | 7/2018 | Katayama ........... | G11C 11/1675 |

* cited by examiner

*Primary Examiner* — Sung Il Cho
(74) *Attorney, Agent, or Firm* — Holtz, Holtz & Volek PC

(57)    ABSTRACT

A memory system includes a first wiring, a second wiring, a memory cell between the first and second wirings, a first power supply line configured to supply a first voltage, a first transistor between the first power supply line and the first wiring, and configured to supply a current necessary to perform a write operation to the memory cell, a second transistor arranged between the first power supply line and the first wiring, and connected in parallel with the first transistor, a second power supply line configured to supply a second voltage to the second wiring corresponding to the memory cell unselected in the write operation, and a first current copy circuit configured to copy a current flowing to the second power supply line from the second wiring corresponding to the memory cell unselected in the write operation, and configured to control the second transistor based on a copied current.

14 Claims, 9 Drawing Sheets

PRIOR ART

MEMORY SYSTEM INCLUDING CURRENT COPY CIRCUIT CONFIGURED TO COPY CURRENT

CROSS REFERENCE TO RELATED APPLICATIONS

This application claims the benefit of priority to Japanese Patent Application No. 2023-035457, filed on Mar. 8, 2023, the entire contents of which are incorporated herein by reference.

FIELD

Embodiments described herein relate generally to a memory system including a storage device.

BACKGROUND

A memory system including a storage device in which a resistance change type memory element or the like is integrated on a semiconductor substrate has been proposed.

BRIEF DESCRIPTION OF DRAWINGS

FIG. 7 is a circuit diagram showing a current copy circuit included in a memory system according to an embodiment.

FIG. 8 is a circuit diagram showing a current copy circuit included in a memory system according to an embodiment.

FIG. 9 is a circuit diagram showing a current copy circuit included in a memory system according to an embodiment.

DESCRIPTION OF EMBODIMENTS

Figure 1:
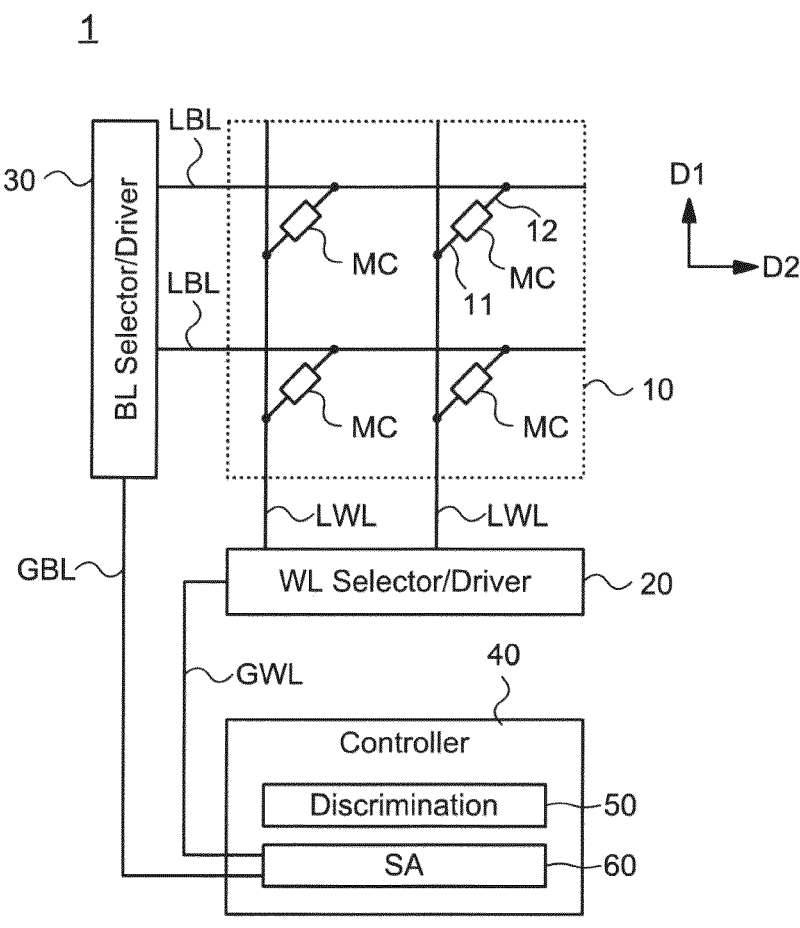
FIG. 1 is a block diagram showing an overall configuration of a memory system according to an embodiment.

According to a memory system of present embodiments, it is possible to provide a memory system capable of stably supplying a current necessary to perform a write operation.

A memory system according to an embodiment includes a plurality of first wirings extending in a first direction, a plurality of second wirings extending in a second direction, a memory cell connected to the first wiring and the second wiring between the first wiring and the second wiring, a first power supply line configured to supply a first voltage, a first transistor arranged between the first power supply line and the plurality of first wirings, and configured to supply a current necessary to perform a write operation to the memory cell, a second transistor arranged between the first power supply line and the plurality of first wirings, and connected in parallel with the first transistor, a second power supply line configured to supply a second voltage to the second wiring corresponding to the memory cell unselected in the write operation, and a first current copy circuit configured to copy a current flowing to the second power supply line from the second wiring corresponding to the memory cell unselected in the write operation, and configured to control the second transistor based on a copied current.

Hereinafter, a nonvolatile semiconductor memory device according to the present embodiments will be described in detail with reference to the drawings. In the following description, elements having substantially same functions and configurations are denoted by the same reference signs, and will be described redundantly only if necessary. Each of the embodiments described below exemplifies an apparatus and a method for embodying technical ideas of this embodiment. The technical ideas of the embodiments are not to specify materials, shapes, structures, arrangements, or the like of component parts to those elements described herein. Various modifications may be made to the technical ideas of the embodiments with respect to claims.

In the embodiments of the present disclosure, a direction from a variable resistance element 101 toward a switching element 102 is referred to as "on" or "above." Conversely, a direction from the switching element 102 toward the variable resistance element 101 is referred to as "under" or "below." As described above, for convenience of explanation, although an explanation is provided using the phrase "above" or "below", for example, the variable resistance element 101 and the switching element 102 may be arranged such that a vertical relationship thereof is opposite to that shown in the figures. In the following descriptions, for example, an expression of the switching element 102 above the variable resistance element 101 merely describes the vertical relationship between the variable resistance element 101 and the switching element 102 as described above, and other members may be disposed between the variable resistance element 101 and the switching element 102. The term "upper" or "lower" means a stacking order in a structure in which a plurality of layers are stacked. A positional relationship in which a word line WL and a bit line BL do not overlap each other in a plan view may be used in the case of expressing the bit line BL being above the word line WL. On the other hand, a case of expressing the bit line BL being vertically above the word line WL means a positional relationship in which the word line WL and the bit line BL overlap each other in a plan view.

As used herein, phrases "α comprises A, B or C", "α comprises any of A, B or C", "α comprises one selected from a group consisting of A, B and C" and the like does not exclude cases where α comprises a plurality of combinations of A to C unless otherwise indicated. Furthermore, these expressions do not exclude a case where α includes other elements.

In the following explanations, although "voltage" refers to a potential difference between two terminals, "voltage" may also refer to a potential based on a voltage VSS or a ground voltage.

1. First Embodiment

A memory system according to a first embodiment will be described with reference to FIG. 1 to FIG. 7. For example, a memory system 1 according to the first embodiment includes a memory cell array 10 in which a plurality of memory cells MC are arranged, and a control circuit 40 for controlling the memory cells.

1-1. Overall Configuration of Memory System

An overall configuration of the memory system according to the first embodiment will be described with reference to FIG. 1. FIG. 1 is a block diagram showing an overall configuration of a memory system according to an embodiment. As shown in FIG. 1, the memory system 1 includes the memory cell array 10, a word line selection/driving circuit 20 (WL Selector/Driver), a bit line selection/driving circuit 30 (BL Selector/Driver), and the control circuit 40 (Controller).

The memory cell array 10 is provided with the plurality of memory cells MC, a plurality of local word lines LWL, and a plurality of local bit lines LBL. Each of the local word lines LWL extends in a direction D1. Each of the local bit lines LBL extends in a direction D2. Each of the memory cells MC is provided between one of the local word lines LWL and one of the local bit lines LBL, and is electrically connected to the local word line LWL and the local bit line LBL. The memory cell MC is a two-terminal memory cell. A first terminal 11 of the memory cell MC is connected to the local word line LWL. A second terminal 12 of the memory cell MC is connected to the local bit line LBL. The local word line LWL and the local bit line LBL intersect each other, which will be described later. The memory cell MC is provided at a position where the local word line LWL and the local bit line LBL intersect each other.

FIG. 1 shows a configuration in which the direction D1 and the direction D2 are perpendicular to each other. However, the direction D1 and the direction D2 may intersect each other at an angle where they are not perpendicular to each other. FIG. 1 shows a configuration in which the local word line LWL extends linearly in the direction D1. However, the local word line LWL may not be linear. The local word line LWL may extend in the direction D1 in the case where the entire local word line LWL is viewed. FIG. 1 shows a configuration in which the local bit line LBL extends linearly in the direction D2. However, the local bit line LBL may not be linear. The local bit line LBL may extend in the direction D2 in the case where the entire local bit line LBL is viewed.

A memory cell MC to be subjected to a write operation and a read operation is designated by selecting one local word line LWL and one local bit line LBL from the plurality of local word lines LWL and the plurality of local bit lines LBL. Specifically, a predetermined current flows through the memory cell MC by applying a predetermined voltage to a specific local word line LWL and the local bit line LBL. The write operation and the read operation are performed on the memory cell MC by flowing the predetermined current through the memory cell MC. In the following explanations, the read operation with respect to the memory cell MC can be referred to as a "sense operation" or a "sense amplifier operation."

The word line selection/driving circuit 20 is provided at a position adjacent to the memory cell array 10 in the direction D1. The local word lines LWL are connected to the word line selection/driving circuit 20.

The bit line selection/driving circuit 30 is provided at a position adjacent to the memory cell array 10 in the direction D2. The local bit lines LBL are connected to the bit line selection/driving circuit 30.

The control circuit 40 is connected to the word line selection/driving circuit 20 and the bit line selection/driving circuit 30. The control circuit 40 includes a discrimination circuit 50 (Discrimination) and a sense amplifier 60 (SA). The control circuit 40 is connected to the word line selection/driving circuit 20 via a global word line GWL, and is connected to the bit line selection/driving circuit 30 via a global bit line GBL. More specifically, the global word line GWL and the global bit line GBL are connected to the sense amplifier 60. As will be described later, the sense amplifier 60 performs the read operation on the memory cell MC.

The control circuit 40 executes the write operation and the read operation in response to a command. The control circuit 40 supplies a control signal to the word line selection/driving circuit 20 and the bit line selection/driving circuit 30 in accordance with an address designated in the write operation and the read operation. The word line selection/driving circuit 20 and the bit line selection/driving circuit 30 select a local word line LWL and a local bit line LBL corresponding to a specified addresses, respectively, in accordance with the control signal. The word line selection/driving circuit 20 and the bit line selection/driving circuit 30 apply a write voltage or a read voltage to the selected local word line LWL and the local bit line LBL, respectively.

In the present embodiment, although a configuration in which one global word line GWL and one global bit line GBL are connected to the control circuit 40 is shown, the configuration is not limited to this configuration. For example, a plurality of global word lines GWL and a plurality of global bit lines GBL may be connected to the control circuit 40. The plurality of global word lines GWL and the plurality of global bit lines GBL may be connected to different memory cell arrays 10, respectively.

The global word line GWL is connectable to the plurality of local word lines LWL. The global bit line GBL is connectable to the plurality of local bit lines LBL.

The discrimination circuit 50 discriminates a data value stored in the memory cell MC based on the voltage (the read voltage) of the memory cell MC obtained by the read operation. As will be described later, the memory cell MC includes the variable resistance element 101 and stores binary data depending on a resistance state (a low resistance state or a high resistance state) of the variable resistance element 101. The data stored in the memory cell MC is discriminated by discriminating a resistance of the variable resistance element 101 being discriminated by the discrimination circuit 50.

1-2. Configuration of Memory Cell Array 10

Figure 2:
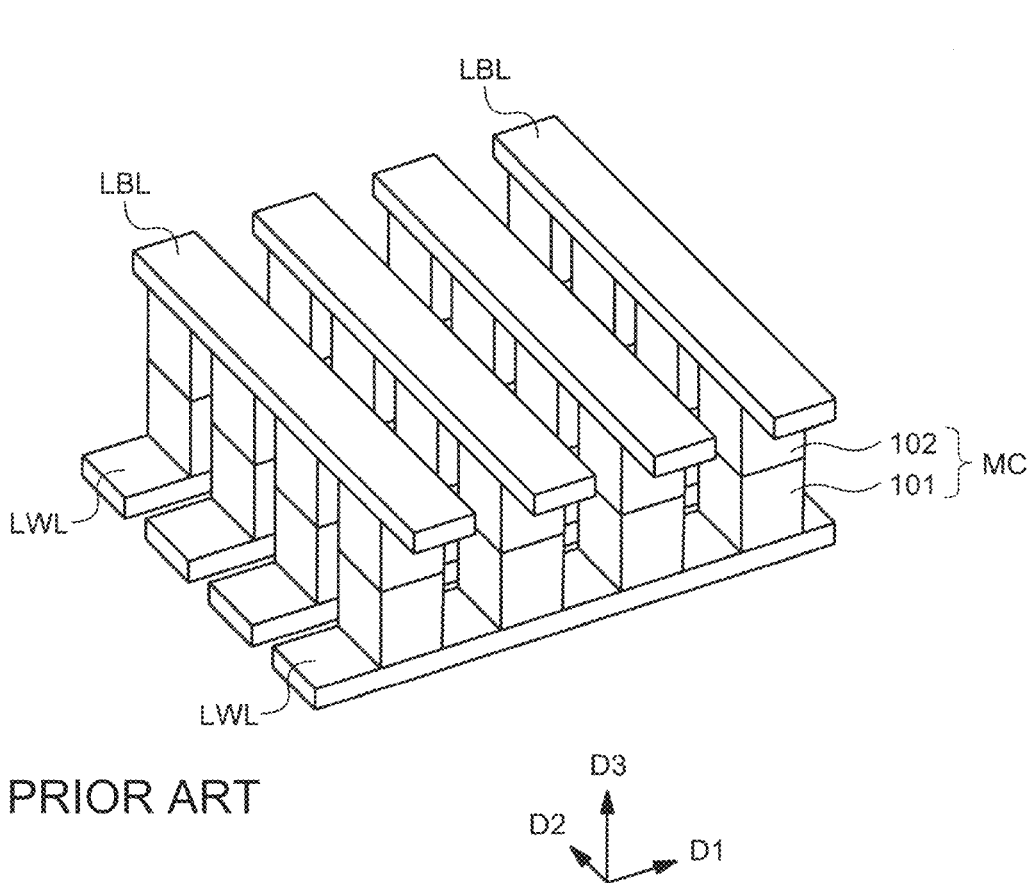
FIG. 2 is a perspective view schematically showing a configuration of a memory cell according to an embodiment.

FIG. 2 is a perspective view schematically showing a configuration of a memory cell according to an embodiment. As shown in FIG. 2, the memory cell MC is provided above (direction D3) the local word line LWL. The local bit line LBL is provided above (direction D3) the memory cell MC. In other words, the memory cell MC is provided between the local word line LWL and the local bit line LBL in regions where the local word line LWL and the local bit line LBL intersect in a view of direction D3 each other. The direction D3 is a direction perpendicular with respect to a plane including the directions D1 and D2.

The memory cell MC includes the variable resistance element 101 and the switching element 102. The variable resistance element 101 and the switching element 102 are connected in series between the local word line LWL and the local bit line LBL. The variable resistance element 101 is provided on a side of the local word line LWL. The switching element 102 is provided on a side of the local bit line LBL.

The variable resistance element 101 is a nonvolatile memory element that can be switched to the low resistance state or the high resistance state. The low resistance state of the variable resistance element 101 may be referred to as a "first low resistance state." The high resistance state of the variable resistance element 101 may be referred to as a "first high resistance state." In the present embodiment, a configuration in which a magnetoresistive element including a magnetic tunnel junction (MTJ) is used as the variable resistance element 101 will be described. Hereinafter, the magnetoresistive element may be referred to as a "MTJ element." The MTJ element is a memory element in which a resistance (a tunnel resistance) due to a tunnel effect in an insulating layer changes depending on a relationship (parallel or non-parallel) between a magnetization directions of two magnetic layers adjacent to each other via the insulating layer. That is, the MTJ element includes a plurality of resistive states (resistive values) according to the relative relationship (magnetization arrangement) between the direction of the magnetization of one magnetic layer and the direction of the magnetization of another magnetic layer.

The switching element 102 is a two-terminal element. The switching element is switched to a low resistance state or a high resistance state in accordance with a voltage applied to the two terminals. The low resistance state of the switching element 102 may be referred to as a "second low resistance state." The high resistance state of the switching element 102 may be referred to as a "second high resistance state." A resistance in the second low resistance state is lower than a resistance in the first low resistance state of the variable resistance element 101 mentioned above. A resistance in the second high resistance state is higher than a resistance in the first high resistance state of the variable resistance element 101 mentioned above. That is, in the case where the switching element 102 is in the second high resistance state, a resistance of the memory cell MC is substantially determined by a resistance of the switching element 102. On the other hand, in the case where the switching element 102 is in the second low resistance state, the resistance of the memory cell MC is substantially determined by the resistance of the variable resistance element 101.

Unlike the configuration of FIG. 2, the variable resistance element 101 may be provided on a side of the local bit line LBL. The switching element 102 may be provided on a side of the local word line LWL. The local word line LWL may be provided above (direction D3) the switching element 102. The local bit line LBL may be provided below (opposite to the direction D3) the variable resistance element 101. Other members may be provided between the local word line LWL and the variable resistance element 101. Similarly, other members may be provided between the local bit line LBL and the switching element 102.

In the present embodiment, although a configuration in which the MTJ element is used as the variable resistance element 101 is described, a variable resistance element other than the MTJ element may be used as the variable resistance element 101. For example, the variable resistance element 101 may be a resistance change type memory element (ReRAM), a ferroelectric memory (FeRAM), an organic memory, or a phase change memory element (PRAM).

1-3. Configuration of MTJ Element

Figure 3:
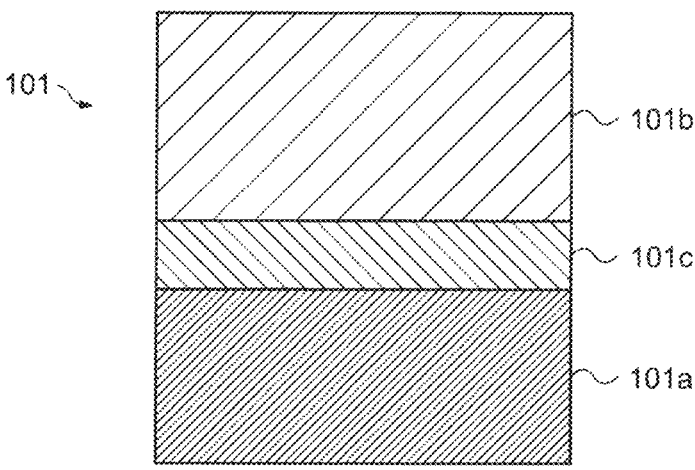
FIG. 3 is a cross-sectional view schematically showing a configuration of a variable resistance element according to an embodiment.
Figure 3:

FIG. 3 is a cross-sectional view schematically showing a configuration of a variable resistance element according to an embodiment. As shown in FIG. 3, the MTJ element used as the variable resistance element 101 includes a storage layer 101*a*, a reference layer 101*b*, and a tunnel barrier layer 101*c*. The storage layer 101*a* is a ferromagnetic layer having a first magnetic property. The reference layer 101*b* is a ferromagnetic layer having a second magnetic property. The tunnel barrier layer 101*c* is a nonmagnetic layer. A magnetization direction of the storage layers 101*a* is variable. A magnetization direction of the reference layer 101*b* is fixed. A write current supplied to the storage layer 101*a* changes the magnetization direction of the storage layer 101*a*. A direction of the write current determines the magnetizing direction of the storage layers 101*a*. On the other hand, even if the write current is supplied to the reference layer 101*b*, the magnetization direction of the reference layer 101*b* does not change. The tunnel barrier layer 101*c* is an insulating layer. The expression "the magnetization direction is variable" means that the magnetization direction can be changed before the write current is supplied (before writing) and after the write current is supplied (after writing). "The magnetization direction is fixed" means that the magnetization direction does not change before the write current is supplied (before writing) and after the write current is supplied (after writing).

In the case where the magnetization direction of the storage layer 101*a* is parallel to the magnetization direction of the reference layer 101*b* (in the case where the magnetization direction is the same direction), the MTJ element is in a low resistance state. In the case where the magnetization direction of the storage layer 101*a* is antiparallel to the magnetization direction of the reference layer 101*b* (in the case where the magnetization direction is the opposite direction), the MTJ element is in the high resistance state. As described above, since the resistance state (the low resistance state or the high resistance state) is controlled according to the magnetization direction of the storage layers 101*a*, the MTJ element can store different binary data based on the resistance state.

Although FIG. 3 shows a configuration in which a bottom-free type MTJ element in which the storage layer 101*a* is provided below the reference layer 101*b* is used as the variable resistance element 101, the configuration is not limited to this configuration. As the variable resistance element 101, a top-free type MTJ element in which the storage layer 101*a* is provided above the reference layer 101*b* may be used. The MTJ element may further include a shift canceling layer that cancels a magnetic field applied from the reference layer 101*b* to the storage layer 101*a*.

1-4. Electrical Properties of Switching Element

Figure 4:
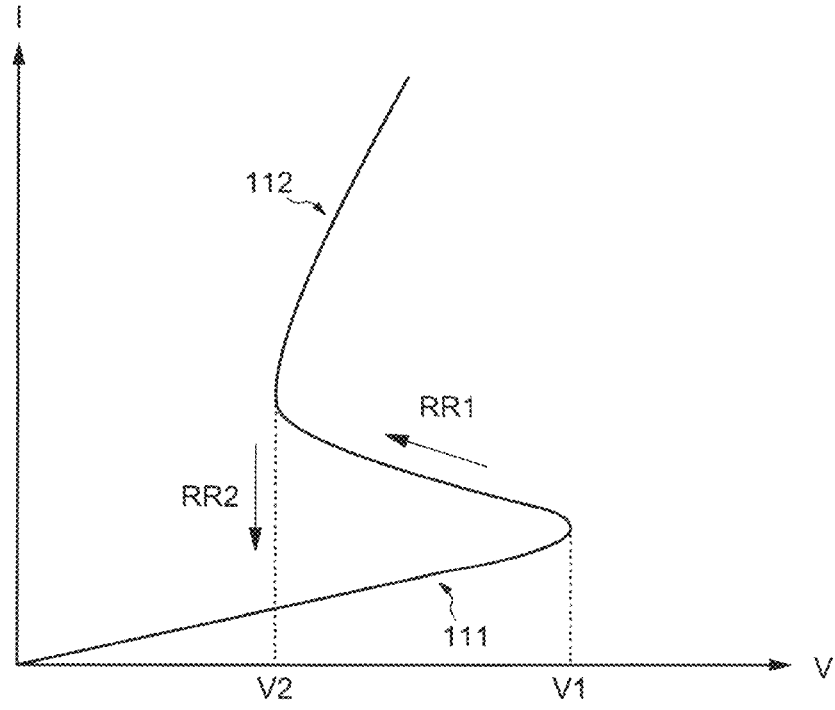
FIG. 4 is a diagram showing electrical properties of a switching element according to an embodiment.

FIG. 4 is a diagram showing electrical properties of a two-terminal type switching element according to an embodiment. As shown in FIG. 4, the switching element 102 is switched from a high resistance state 111 to a low resistance state 112 if the voltage applied between the two terminals is increased to reach a first voltage V1. The switching element 102 has a property that when the switching element 102 is switched to the low resistance state 112, the voltage between the two terminals shifts to a second voltage V2 lower than the first voltage V1, and a current rapidly increases. Further, the switching element 102 has a property that when a voltage applied between the two terminals is decreased and reaches the second voltage V2, the switching element 102 is switched from the low resistance state 112 to the high resistance state 111. That is, the switching element 102 follows a negative resistance region between the voltage V1 and the voltage V2 when switched from the high resistance state 111 to the low resistance state 112 (arrow RR1), but transitions to the high resistance state 111 without following the negative resistance region when switched from the low resistance state 112 to the high resistance state 111 (arrow RR2). The switching element 102 has electrical properties symmetrical to each other in both directions (positive direction and negative direction) with respect to the original coordinates.

As an example, the switching element 102 of the present embodiment has a property that, when an applied voltage reaches the voltage V1 as described above, a resistance value of the switching element 102 decreases rapidly, and accordingly, the applied voltage decreases rapidly to the voltage V2 and a current increases (snaps back). The switching element 102 of the present embodiment is the two-terminal type switching element. Material compositions used for the switching element having such properties are appropriately selected in accordance with properties of a memory cell.

The write operation and the read operation for the variable resistance element 101 can be performed by applying a predetermined voltage between the local word line LWL and the local bit line LBL and switching the switching element 102 to the low resistance state.

1-5. Electrical Properties of Memory Cell MC

Figure 5:
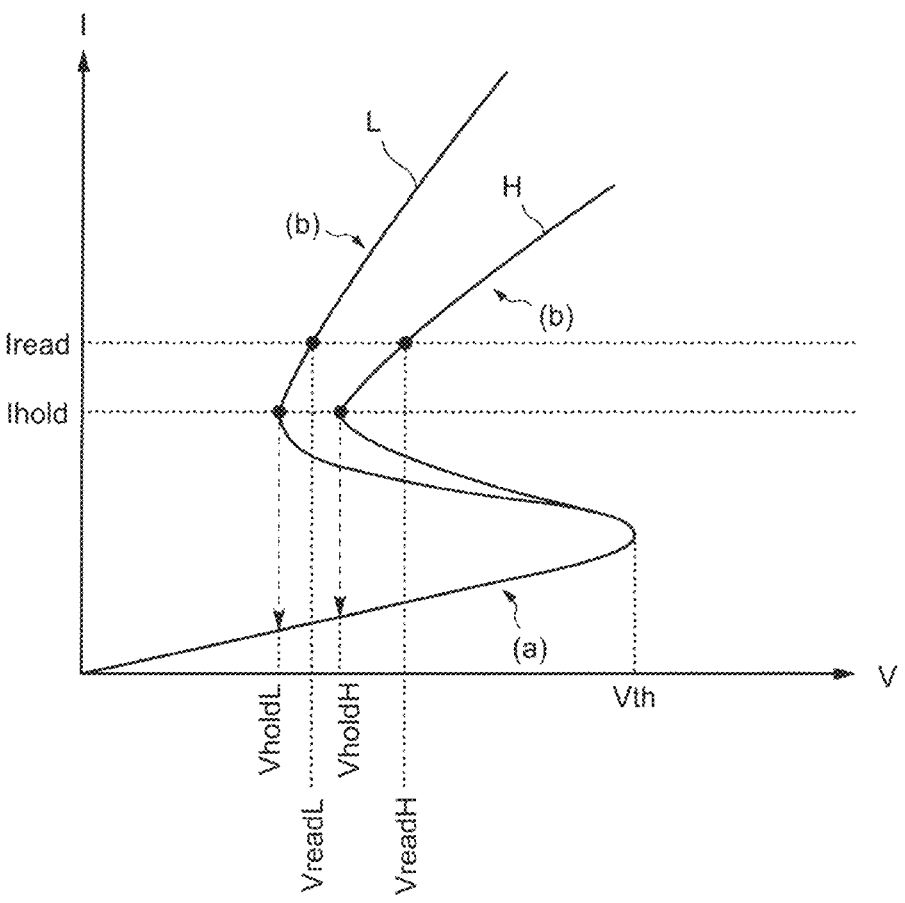
FIG. 5 is a diagram showing electrical properties during a read operation of the memory cell according to an embodiment.

FIG. 5 is a diagram schematically showing electric properties of a selected memory cell MC during the read operation. In FIG. 5, the horizontal axis represents a voltage between two terminals of the selected memory cell MC (a voltage applied between the local word line LWL and the local bit line LBL), and the vertical axis represents a current flowing through the selected memory cell MC. A property (L) is a property when the variable resistance element 101 is in the low resistance state. A property (H) is a property when the variable resistance element 101 is in the high resistance state.

As described above, the resistance of the switching element 102 in the high resistance state is higher than the resistance of the variable resistance element 101 in the high resistance state. Here, the resistance of the memory cell MC is substantially determined by the resistance of the switching element 102. Therefore, the electric properties (corresponding to the property part (a)) of the memory cell MC before the switching element 102 is switched from the high resistance state to the low resistance state are substantially the same even in the case where the variable resistance element 101 is in the low resistance state or in the high resistance state. That is, a voltage (threshold voltage Vth) applied between the two terminals of the memory cell MC when the switching element 102 is switched from the high resistance state to the low resistance state is substantially the same even in the case where the switching element 102 is whether in the low resistance state or in the high resistance state.

On the other hand, since the resistance of the switching element 102 in the low resistance state is lower than the resistance of the variable resistance element 101 in the low resistance state, the resistance of the memory cell MC is substantially determined by the resistance of the variable resistance element 101 after the switching element 102 is switched from the high resistance state to the low resistance state. Therefore, with respect to the electrical properties (corresponding to the property part (b)) of the memory cell MC after the switching element 102 is switched from the high resistance state to the low resistance state, the electrical properties in the case where the variable resistance element 101 is in the low resistance state differ from the electrical properties in the case where the variable resistance element 101 is in the high resistance state. Specifically, with respect to gradients of voltage-current in the property portion (b), the gradient in the case where the variable resistance element 101 is in the high resistance state is smaller than the gradient in the case where the variable resistance element 101 is in the low resistance state.

As shown in FIG. 5, with respect to a read current Iread in the read operation, a read voltage in the case where the variable resistance element 101 is in the low resistance state is VreadL, and a read voltage in the case where the variable resistance element 101 is in the high resistance state is VreadH. The read voltage VreadL is smaller than the read voltage VreadH. Based on a difference between the read voltage VreadL and the read voltage VreadH, the resistance state (low resistance state or high resistance state) of the variable resistance element 101 can be discriminated.

In FIG. 5, a hold current Ihold is a current flowing through the memory cell MC when the switching element 102 is switched from the low resistance state to the high resistance state. A hold voltage Vhold is a voltage applied between two terminals of the memory cell MC when the hold current Ihold flows through the memory cell MC. In the case where the variable resistance element 101 is in the low resistance state, the hold voltage is VholdL. In the case where the variable resistance element 101 is in the high resistance state, the hold voltage is VholdH. If the hold voltage VholdL and the hold voltage VholdH are not specifically distinguished, they are simply referred to as hold voltages Vhold.

1-6. Functional Configuration of Discrimination Circuit

Figure 6:
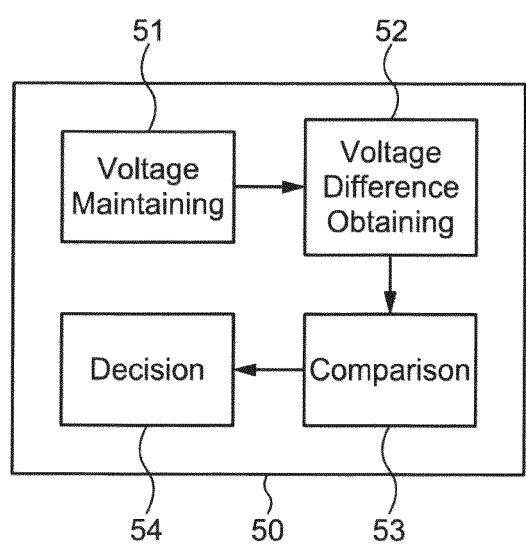
FIG. 6 is a block diagram showing a functional configuration of a discrimination circuit included in the memory system according to an embodiment.

FIG. 6 is a block diagram showing a functional configuration of a discrimination circuit included in the memory system according to an embodiment. As shown in FIG. 6, the discrimination circuit 50 includes a voltage maintaining unit 51 (Voltage Maintaining), a voltage difference obtaining unit 52 (Voltage Difference Obtaining), a comparison unit 53 (Comparison), and a discrimination unit 54 (Decision).

The voltage maintaining unit 51 holds the read voltage (VreadL or VreadH) obtained by the read operation of the memory cell MC as a discrimination target voltage. As described above, the read operation of the data stored in the memory cell MC may be referred to as a "first read operation." The discrimination target voltage may be referred to as a "first target voltage."

Further, the voltage maintaining unit 51 holds a reference voltage for performing data discrimination on the discrimination target voltage. The reference voltage is obtained by a second read operation performed after the first read operation. The reference voltage may be referred to as a "second target voltage." After the first read operation, the write operation to the variable resistance element 101 is performed. The second read operation is performed after the variable resistance element 101 is switched to the low resistance state or the high resistance state by the write operation. The resistance state of the variable resistance element 101 when the first read operation is performed may be referred to as a "discrimination target resistance state." The resistance state of the variable resistance element 101 when the second read operation is performed may be referred to as a "reference resistance state."

The voltage difference obtaining unit 52 obtains a voltage difference between the discrimination target voltage held by the voltage maintaining unit 51 and the reference voltage.

The comparison unit 53 compares the voltage difference obtained by the voltage difference obtaining unit 52 with a reference voltage difference. The reference voltage difference is, for example, a value obtained by multiplying the voltage difference between the read voltage VreadL in the case where the variable resistance element 101 is in the low resistance state and the read voltage VreadH in the case where the variable resistance element 101 is in the high resistance state by ½.

The discrimination unit 54 discriminates the resistance state of the variable resistance element 101 based on a comparison result obtained by the comparison unit 53. Specifically, in the case where a voltage difference between the discrimination target voltage and the reference voltage is smaller than the reference voltage difference, it is discriminated that the discrimination target resistance state of the variable resistance element 101 is the same resistance state as the reference resistance state. In the case where the voltage difference between the discrimination target voltage and the reference voltage is larger than the reference voltage difference, it is discriminated that the discrimination target resistance state of the variable resistance element 101 is a resistance state different from the reference resistance state.

1-7. Configuration of Current Copy Circuit

Figure 7:
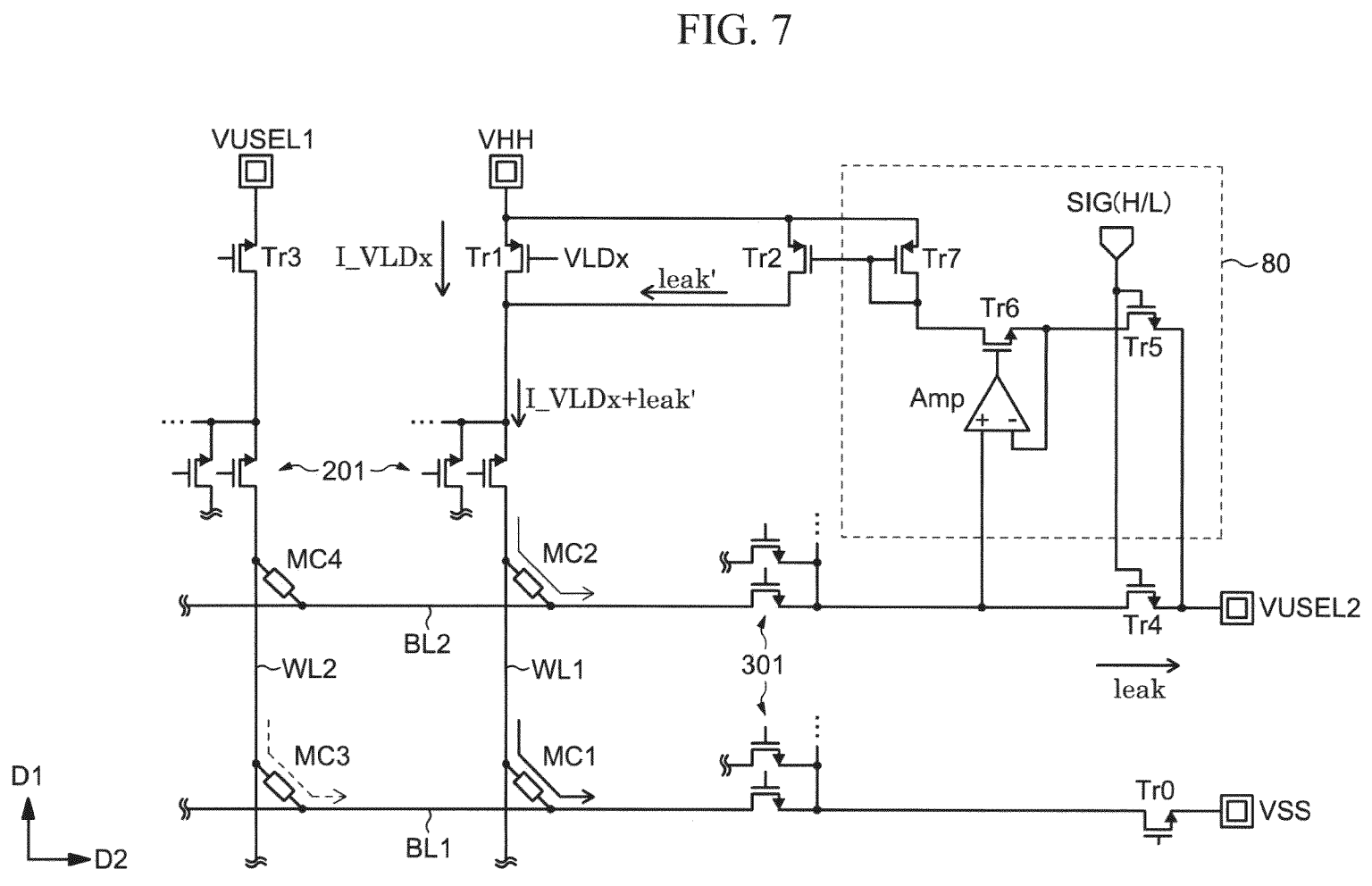

FIG. 7 is a circuit diagram showing a current copy circuit included in a memory system according to an embodiment. A current copy circuit 80 shown in FIG. 7 detects a leakage current (leak) flowing from the word line WL to the bit line BL via a non-selected memory cell MC, and copies the leakage current (leak). As will be described later, a copied current (leak') generated by a current copied by the current copy circuit 80 is supplied to the word line WL together with a write current I_VLDx, whereby a desired write current I_VLDx is supplied to the memory cell MC which is a target of the write operation.

FIG. 7 is a diagram showing the memory cell array 10, the word line selection/driving circuit 20, and the bit line selection/driving circuit 30 shown in FIG. 1 in more detail. As shown in FIG. 7, the memory system 1 includes a plurality of word lines WL (WL1 and WL2), a plurality of bit lines BL (BL1 and BL2), a plurality of memory cells MC (MC1 to MC4), a power supply line VHH, transistors Tr1 to Tr4, power supply lines VUSEL1 and VUSEL2, and the current copy circuit 80. The word line WL extends in the direction D1. The transistors Tr1 and Tr2 are PMOS transistors (hereinafter referred to as "PMOS"). The transistors Tr3 and Tr4 are NMOS transistors (hereinafter referred to as "NMOS"). The bit line BL extends in the direction D2. The word line WL may be referred to as a "first wiring." The bit line BL may be referred to as a "second wiring." In FIG. 7, although a configuration in which the direction D1 and the direction D2 are orthogonal to each other is shown, the direction D1 and the direction D2 may intersect at an angle that is not orthogonal to each other. The memory cell MC is connected to the word line WL and the bit line BL between the word line WL and the bit line BL.

The word line WL and the bit line BL shown in FIG. 7 respectively correspond to the local word line LWL and the local bit line LBL shown in FIG. 1. In FIG. 7, the word lines WL1 and WL2 among a plurality of word lines WL are shown. Similarly, in FIG. 7, the bit lines BL1 and BL2 among a plurality of bit lines BL are shown. Similarly, the memory cells MC1 to MC4 among the plurality of memory cells MC are shown in FIG. 7.

The word lines WL1 and WL2 are connected to the power supply lines VHH and VUSEL1 via a selection circuit 201. The selection circuit 201 includes a plurality of transistors. The plurality of transistors are connected in parallel between the word line WL1 and the power supply line VHH and between the word line WL2 and the power supply lines VUSEL1. One word line WL of the plurality of word lines WL is connected to the power supply line VHH, and the other word lines WL are connected to the power supply line VUSEL1 by supplying a control signal to gate terminals of the plurality of transistors. The word line WL connected to the power supply line VHH is referred to as a selected word line WL. The word line WL connected to the power supply line VUSEL1 is referred to as a non-selected word line WL. The power supply line VHH supplies a voltage Vhh. The power supply line VHH is referred to as a "first power supply line." The voltage Vhh may be referred to as a "first voltage."

Transistors Tr1 and Tr2 are connected in parallel between the power supply line VHH and the plurality of word line WL. The transistor Tr1 supplies the current (write current I_VLDx) required for the write operation to the memory cell MC by suppling a control signal VLDx to a gate terminal of the transistor Tr1. As will be described later, the current copy circuit 80 copies the same current as the leakage current (leak) in the write operation, and controls the transistor Tr2 based on the copied current, thereby causing the same copied current [leak'] as the leakage current (leak) to flow through the transistor Tr2. The transistor Tr1 may be referred to as a "first transistor." The transistor Tr2 may be referred to as a "second transistor."

The transistor Tr3 is connected between the power supply line VUSEL1 and the plurality of word line WL. The power line VUSEL1 supplies a voltage Vusel. The power supply line VUSEL1 is referred to as a "third power supply line." The voltage Vusel supplied to the power supply line VUSEL1 may be referred to as a "third voltage." The transistor Tr3 may be referred to as a "third transistor." The transistor Tr3 functions as a switching element that switches between an ON state and an OFF state. The non-selected word line WL is supplied with the voltage Vusel by controlling the transistor Tr3 to be in the ON state. For example, the voltage Vusel is about half the threshold voltage Vth. The voltage Vusel may be set near 0 V (including a negative power supply) depending on the circuit configuration.

The bit lines BL1 and BL2 are connected to the power supply lines VSS and VUSEL2 via a selection circuit 301. The selection circuit 301 includes a plurality of transistors. The plurality of transistors are connected in parallel between the bit line BL1 and the power supply line VSS, and between the bit line BL2 and the power supply line VUSEL2. One bit line BL of the plurality of bit lines BL is connected to the power supply line VSS, and the other bit lines BL are connected to the power supply line VUSEL2 by supplying a control signal to the gate terminals of the plurality of transistors. The bit line BL connected to the power supply line VSS is referred to as a selected bit line BL. The bit line BL connected to the power supply line VUSEL2 is referred to as a non-selected bit line BL.

The transistor Tr4 is connected between the power supply line VUSEL2 and the plurality of bit lines BL. The power line VUSEL2 supplies the voltage Vusel. The power supply line VUSEL2 is referred to as a "second power supply line." The voltage Vusel supplied to the power supply line VUSEL2 may be referred to as a "second voltage." The transistor Tr4 includes a first terminal connected to the selection circuit 301 and a second terminal connected to the power supply line VUSEL2 (second power supply line). The transistor Tr4 is NMOS. The transistor Tr4 may be referred to as a "fourth transistor." The power line VSS supplies a voltage Vss. The power supply line VSS is referred to as a "fourth power supply line." The voltage Vss may be referred to as a "fourth voltage."

A transistor Tr0 is connected between the power supply line VSS and the plurality of bit lines BL. The transistor Tr0 functions as a switching element that switches between an ON state and an OFF state. The voltage VSS is supplied to the selected bit line BL by controlling the transistor Tr0 to be in the ON state.

In FIG. 7, a memory cell MC connected to the selected word line WL and the selected bit line BL are target of the write operation. Other memory cells MC are not subject to the write operation. In other words, the memory cell MC connected to at least one of the non-selected word line WL and the non-selected bit line BL is not subject to the write operation. The memory cell MC that is the target of the write operation is referred to as a selected memory cell MC. The memory cell MC not subject to the write operation is referred to as a non-selected memory cell MC. In FIG. 7, the memory cell MC1 is the selected memory cell MC, and the memory cells MC2 to 4 are the non-selected memory cells MC.

In other words, the power supply line VHH is connected to the selected word line WL1 corresponding to the selected memory cell MC1, and the power supply line VUSEL1 is connected to the non-selected word line WL2 corresponding to the non-selected memory cells MC3 and MC4. Similarly, the power supply line VSS is connected to the selected bit line BL1 corresponding to the selected memory cell MC1, and the power supply line VUSEL2 is connected to the non-selected bit line BL2 corresponding to the non-selected memory cells MC2 and MC4.

Ideally, a write current flows only in the memory cell MC1, and no current flows in the remaining memory cells MC2 to MC4 in the write operation. However, since a potential difference is generated between two terminals (between a source terminal and a drain terminal) in each of the memory cells MC2 and MC3 in the actual write operation, a weak leakage current flows in the memory cells MC2 and MC3. Among the plurality of memory cells MC connected to the word line WL1, a leakage current similar to the leakage current flowing in the memory cell MC2 flows in the memory cell MC other than the memory cells MC1 and MC2. The leakage current passes through the transistor Tr4 via the selection circuit 301. Similarly, among the plurality of memory cells MC connected to the bit line BL1, a leakage current similar to the leakage current flowing in the memory cell MC3 flows in the memory cell MC other than the memory cells MC1 and MC3. The leakage current passes through the transistor Tr4 via the selection circuit 301. The current passing through the transistor Tr4 is referred to as the leakage current (leak). If the transistor Tr2 is not arranged and the write current I_VLDx is supplied to the word line WL1, a current of "(I_VLDx)–(leak)" obtained by subtracting the leakage current (leak) from the desired current (write current I_VLDx) is supplied to the selected memory cell MC1. That is, the current required for the write operation cannot be supplied to the selected memory cell MC1.

The current copy circuit 80 includes an amplifier element Amp and transistors Tr5 to Tr7. The transistors Tr5 and Tr6 are NMOS. The transistor Tr7 is PMOS. The current copy circuit 80 detects the leakage current (leak) flowing through the transistor Tr4 during the write operation, copies the same current as the leakage current (leak), and controls the transistor Tr2 based on the copied current. The current copy circuit 80 causes the same copied current (leak') as the leakage current (leak) to flow through the transistor Tr2 by this control. The amplifier element Amp is connected to the transistor Tr4. Specifically, the first terminal of the transistor Tr4 is connected to a first input terminal "+" of the amplifier element Amp. The transistor Tr5 includes a first terminal connected to a second input terminal "–" of the amplifier element Amp, and a second terminal connected to the power supply line VUSEL2 (second power supply line). The transistors Tr4 and Tr5 are commonly controlled by supplying a control signal SIG (H/L) to each of gate terminals of the transistors Tr4 and Tr5.

The transistor Tr6 is connected to the transistor Tr5 and the amplifier element Amp. Specifically, a gate terminal of the transistor Tr6 is connected to an output terminal of the amplifier element Amp. The transistor Tr6 is connected to the first terminal of the transistor Tr5. The amplifier element Amp controls the gate terminal of the transistor Tr6 such that inputs to the first input terminal "+" and the second input terminal "–" have the same potential. The same current as the current flowing through the transistor Tr4 is supplied to the transistors Tr5 and Tr6 by this control.

The transistor Tr7 configures a current mirror circuit with the transistor Tr2. First terminals of the transistors Tr2 and Tr7 are both connected to the power supply line VHH (first power supply line). A second terminal of the transistor Tr2 is connected to the plurality of word line WL via the selection circuit 201. A second terminal of the transistor Tr7 is connected to a gate terminal of the transistor Tr7 and the transistor Tr6. The transistors Tr2 and Tr7 share the gate terminal. The transistors Tr5 to Tr7 are connected in series between the power supply line VHH and the power supply line VUSEL2. Therefore, the same current as the current flowing through the transistor Tr4 is supplied to the transistor Tr7 as in the transistors Tr5 and Tr6 by controlling the transistor Tr6 by the amplifier element Amp. As a result, the same current as the current flowing through the transistor Tr4 is also supplied to the transistor Tr2.

As described above, the current copy circuit 80 copies the current (leak) flowing from the bit line BL (second wiring) corresponding to the non-selected memory cell MC to the power supply line VUSEL2 (second power supply line), and controls the transistor Tr2 (second transistor) based on the copied current. The current copy circuit 80 may be referred to as a "first current copy circuit." The current copy circuit 80 causes the copied current (leak') to flow through the transistor Tr2. Therefore, the selected word line WL is supplied with the same copied current (leak') as the leakage current (leak) in addition to the write current I_VLDx.

The amplifier element Amp and the transistor Tr6 may be collectively referred to as a "first amplifier circuit." The transistor Tr4 may be referred to as a "fourth transistor." The transistor Tr5 may be referred to as a "fifth transistor." The current mirror circuit constituted by the transistors Tr2 and Tr7 may be referred to as a "first current mirror circuit." In this case, the configuration of FIG. 7 can be expressed as follows. The first current mirror circuit is connected to the first amplifier circuit. The transistor Tr2 is included in the first current mirror circuit. The transistor Tr6 is provided between the transistor Tr5 and the first current mirror circuit.

As described above, according to the memory system 1 of the present embodiment, the write current I_VLDx can be stably supplied to the selected memory cell MC by copying the leakage current (leak) flowing in the transistor Tr4 and supplying the same copied current (leak') as the leakage current (leak) to the selected word line WL in addition to the write current I_VLDx.

2. Second Embodiment

The memory system 1 according to a second embodiment will be described with reference to FIG. 8 to FIG. 9. A memory system according to the second embodiment is similar to the memory system according to the first embodiment. In the following description, description of the same configuration as that of the memory system according to the first embodiment will be omitted, and differences from the memory system according to the first embodiment will be mainly described.

2-1. Configuration of Current Copy Circuit

Figure 8:
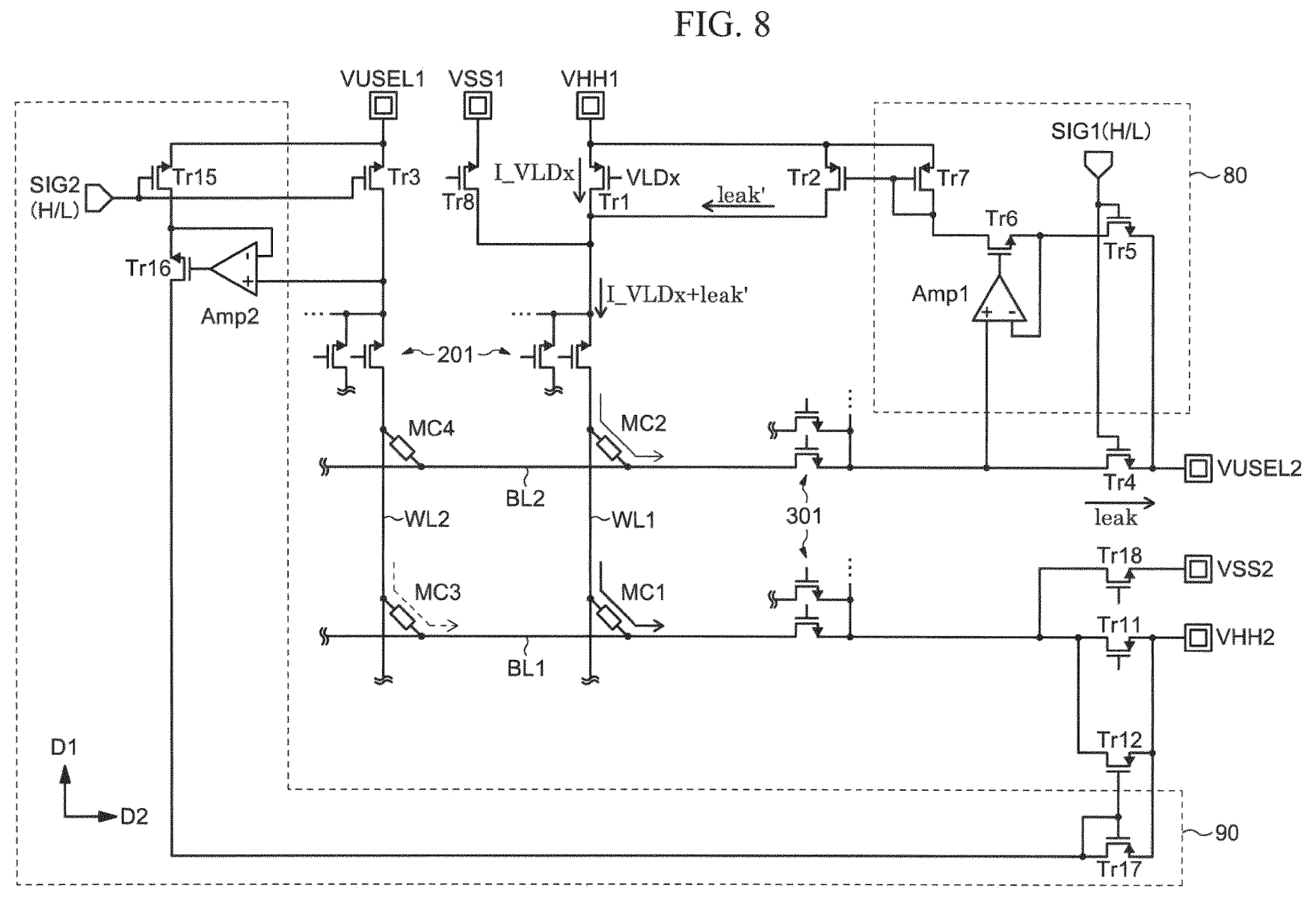
Figure 9:
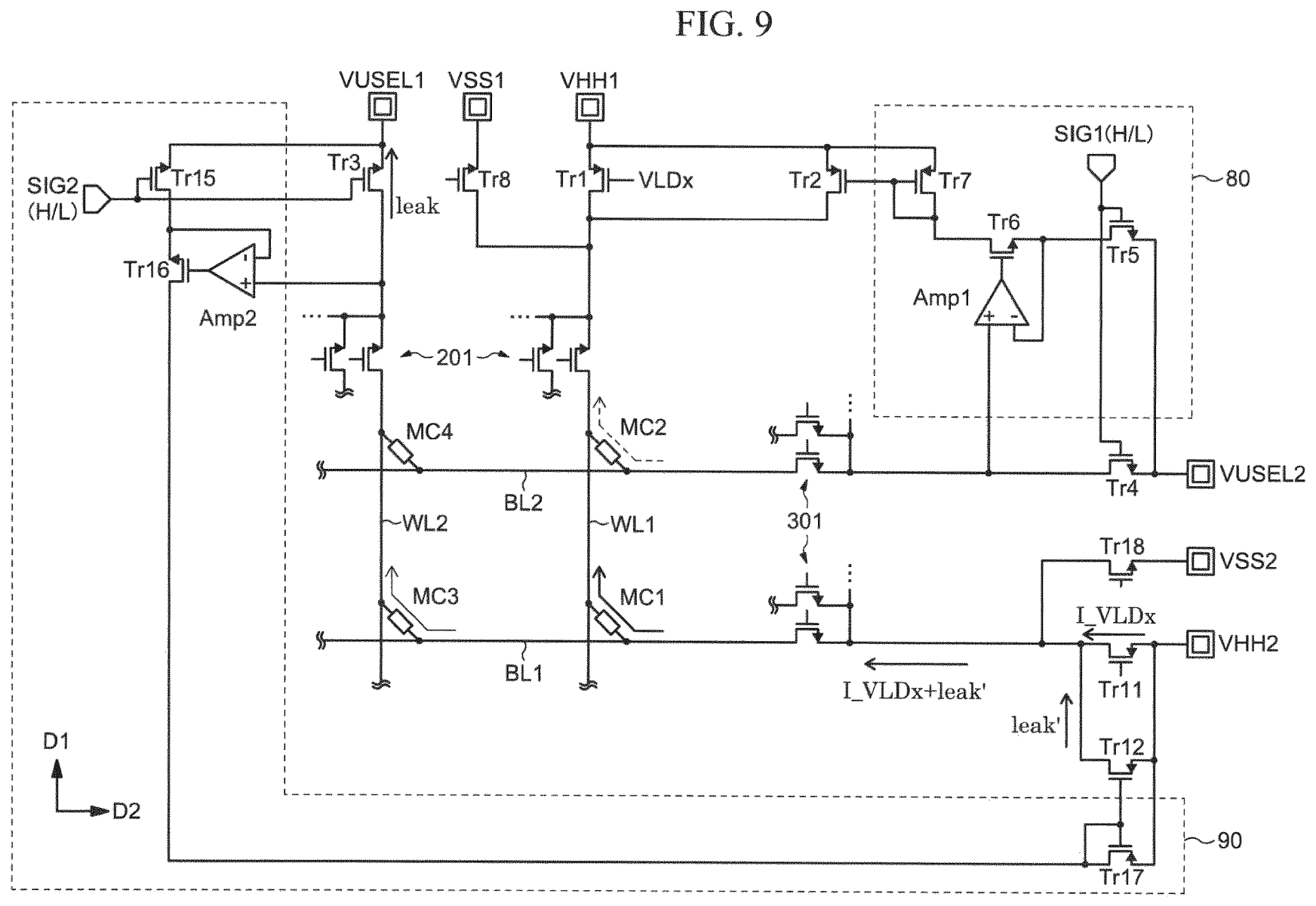

FIG. 8 and FIG. 9 are circuit diagrams showing a current copy circuit included in a memory system according to an embodiment. The same circuit diagrams are shown in FIG. 8 and FIG. 9. FIG. 8 and FIG. 9 are diagrams for explaining write operations. Referring to FIG. 8 and FIG. 9, a configuration in which the magnetoresistive element including the magnetic tunnel junction (MTJ) described with reference to FIG. 3 is used as a memory cell (MC) will be described. That is, depending on the current flowing through the memory cell (MC), the memory cells may have different resistance states (resistance values). FIG. 8 and FIG. 9 exemplify a configuration in which currents in different direction flows in the memory cell. The write operation shown in FIG. 8 is referred to as a "forward write operation", and the write operation shown in FIG. 9 is referred to as a "reverse write operation."

The current copy circuit 80 according to the present embodiment supplies the copied current (leak') in addition to the write current I_VLDx during the forward write operation shown in FIG. 8 as in the first embodiment. A current copy circuit 90 supplies the copied current (leak') in addition to the write current I_VLDx during the reverse write operation shown in FIG. 9.

The circuit diagrams shown in FIG. 8 and FIG. 9 are similar to the circuit diagram shown in FIG. 7. In the following description, description of the same configuration as that of FIG. 7 will be omitted, and a configuration different from that of FIG. 7 will be mainly described. A power supply line VHH1, an amplifier element Amp1, and a control signal SIG1 (H/L) in FIG. 8 and FIG. 9 respectively correspond to the power supply line VHH, the amplifier element Amp, and the control signal SIG (H/L) in FIG. 7.

The circuit configuration of the present embodiment will be described with reference to FIG. 8. As shown in FIG. 8, in addition to the configuration shown in FIG. 7, the memory system 1 includes power supply lines VSS1 and VSS2, a power supply line VHH2, transistors Tr8, Tr11, Tr12, and Tr18, and the current copy circuit 90. The current copy circuit 90 includes an amplifier element Amp2 and transistors Tr15 to Tr17. The transistors Tr8, Tr15, and Tr16 are NMOS. The transistors Tr11, Tr12, Tr17, and Tr18 are PMOS.

The power supply line VSS1 is connected to the plurality of word line WL via the transistor Tr8 and the selection circuit 201. In the case where the forward write operation is performed on the memory cell MC, the transistor Tr1 is controlled to be in the ON state and the transistor Tr8 is controlled to be in the OFF state. In addition to the above control, the transistor Tr2 may be controlled so that no current flows through the transistor Tr2. In order to realize this control, a circuit that connects the gate terminal of the transistors Tr2 and Tr7 and the power supply line VHH1 via the switching element may be added. Alternatively, a PMOS switching element may be added to the second terminal of the transistor Tr2. In the case described above, ideally no current flows through the transistor Tr4, so that no current flows through the transistor Tr2. However, even if a current flows through the transistor Tr2, it is possible to suppress generation of a leakage current flowing through a path of the power supply line VHH1→the transistor Tr2→the transistor Tr8→the power supply line VSS1.

In the case where the reverse write operation is performed on the memory cell MC, the transistor Tr1 is controlled to be in the OFF state and the transistor Tr8 is controlled to be in the ON state.

The transistors Tr11 and Tr12 are connected in parallel between the power supply line VHH2 and the plurality of bit lines BL. As will be described later, the transistor Tr11 supplies a current (write current I_VLDx) required for the reverse write operation with respect to the memory cell MC by supplying the control signal VLDx to the gate terminal of the transistor Tr11. As will be described later, the current copy circuit 90 copies the same current as the leakage current (leak) in the reverse write operation, and controls the transistor Tr12 based on the copied current. The current copy circuit 90 causes the same copied current (leak') as the leakage current (leak) to flow through the transistor Tr12 by this control.

The power supply line VSS2 is connected to the plurality of bit lines BL via the transistor Tr18 and the selection circuit 301. In the case where the reverse write operation is performed on the memory cell MC, the transistor Tr11 is controlled to be in the ON state and the transistor Tr18 is controlled to be in the OFF state. In the case where the forward write operation is performed on the memory cell MC, the transistor Tr11 is controlled to be in the OFF state and the transistor Tr18 is controlled to be in the ON state.

As described above, in the case where the forward write operation is performed, the transistors Tr1 and Tr18 are controlled to be in the ON state and the transistors Tr8 and Tr11 is controlled to be in the OFF state. This state is substantially the same as the state shown in FIG. 7. That is, in the forward write operation, the current copy circuit 80 copies the leakage current (leak) flowing through the transistor Tr4, and supplies the same copied current (leak') as the leakage current (leak) to the selected word line WL in addition to the write current I_VLDx.

The current copy circuit 90 will be described with reference to FIG. 9. As shown in FIG. 9, the current copy circuit 90 detects the leakage current (leak) flowing through the transistor Tr3 during the reverse write operation, copies the same current as the leakage current (leak), and controls the transistor Tr12 based on the copied current. The current copy circuit 90 causes the same copied current (leak') as the leakage current (leak) to flow through the transistor Tr12 by this control. The amplifier element Amp2 is connected to the transistor Tr3. Specifically, a first terminal of the transistor Tr3 is connected to a first input terminal "+" of the amplifier element Amp2. The transistor Tr15 includes a first terminal connected to a second input terminal "–" of the amplifier element Amp2 and a second terminal connected to the power supply line VUSEL1. The transistors Tr3 and Tr15 are commonly controlled by supplying a control signal SIG2 (H/L) to each of gate terminals of the transistors Tr3 and Tr15.

The transistor Tr16 is connected to the transistor Tr15 and the amplifier element Amp2. Specifically, a gate terminal of the transistor Tr16 is connected to an output terminal of the amplifier element Amp2. The transistor Tr16 is connected to the first terminal of the transistor Tr15. The amplifier element Amp2 controls a gate terminal of the transistor Tr16 such that inputs to the first input terminal "+" and the second input terminal "–" have the same potential. The same current as the current flowing through the transistor Tr3 is supplied to the transistors Tr15 and Tr16 by this control.

The transistor Tr17 configures a current mirror circuit with the transistor Tr12. First terminals of the transistors Tr12 and Tr17 are connected to the power supply line VHH2. A second terminal of the transistor Tr17 is connected to a gate terminal of the transistor Tr17 and the transistor Tr16. The transistors Tr12 and Tr17 share the gate terminal. The transistors Tr15 to Tr17 are connected in series between the power supply line VHH2 and the power supply line VUSEL1. Therefore, the same current as the current flowing through the transistor Tr3 is supplied to the transistor Tr17 as in the transistors Tr15 and Tr16 by controlling the transistor Tr16 by the amplifier element Amp2. As a result, the same current as the current flowing through the transistor Tr3 is also supplied to the transistor Tr12.

As described above, the current copy circuit 90 copies the current (leak) flowing from the bit line BL corresponding to the non-selected memory cell MC to the power supply line VUSEL1, and controls the transistor Tr12 based on the copied current. The current copy circuit 90 causes the copied current (leak') to flow through the transistor Tr12. Therefore, the selected bit line BL is supplied with the same copied current (leak') as the leakage current (leak) in addition to the write current I_VLDx.

In the operation of FIG. 9, the transistors Tr1 and Tr18 are controlled to be in the ON state and the transistors Tr8 and Tr11 are controlled to be in the OFF state. In order to realize this control, a circuit that connects the gate terminals of the transistors Tr12 and Tr17 and the power supply line VHH2 via the switching element may be added. Alternatively, a PMOS switching element may be added to the second terminal of the transistor Tr12. In the case described above, ideally no current flows through the transistor Tr3, and therefore no current flows through the transistor Tr12. However, even if a current flows through the transistor Tr12, it is possible to suppress generation of a leakage current flowing through a path of the power supply line VHH2→the transistor Tr12→the transistor Tr18→the power supply line VSS2.

The current copy circuit 90 may be referred to as a "second current copy circuit." The power supply line VHH2 is referred to as a "third power supply line." The transistor Tr11 may be referred to as a "third transistor." The transistor Tr12 may be referred to as a "fourth transistor." The power supply line VUSEL1 is referred to as a "fourth power supply line." In this case, the configurations of FIG. 8 and FIG. 9 can be expressed as follows. The current copy circuit 90 (second current copy circuit) copies the current flowing from the word line WL (first wiring) corresponding to the non-selected memory cell MC to the power supply line VUSEL1 (fourth power supply line), and controls the transistor Tr12 (fourth transistor) based on the copied current. The power supply line VHH2 (third power supply line) supplies the voltage Vhh (first voltage). The transistor Tr11 (third transistor) is provided between the power supply line VHH2 (third power supply line) and the plurality of bit lines BL (second lines), and supplies a current required for the write operation to the selected memory cell MC. The transistor Tr12 (fourth transistor) is connected in parallel with the transistor Tr11 (third transistor) between the power supply line VHH2 (third power supply line) and the plurality of bit lines BL (second lines). The power supply line VUSEL1 (fourth power supply line) supplies the voltage Vusel (third voltage) to the word line WL corresponding to the non-selected memory cell MC.

The transistor Tr3 may be referred to as a "fifth transistor." The transistor Tr4 may be referred to as a "sixth transistor." The power supply line VSS2 is referred to as a "fifth power supply line." The transistor Tr18 may be referred to as a "seventh transistor." The power supply line VSS1 may be referred to as a "sixth power supply line." The transistor Tr8 may be referred to as an "eighth transistor." In this case, the configurations of FIG. 8 and FIG. 9 can be expressed as follows. The transistor Tr3 (fifth transistor) is provided between the power supply line VUSEL1 (fourth power supply line) and the plurality of word lines WL (first wirings). The transistor Tr4 (sixth transistor) is provided between the power supply line VUSEL2 (second power supply line) and the plurality of bit lines BL (second wirings). The power supply line VSS2 (fifth power supply line) supplies the voltage Vss (fourth voltage) to the bit line BL (second wiring) corresponding to the selected memory cell MC in the forward write operation. The transistor Tr18 (seventh transistor) is provided between the power supply line VSS2 (fifth power supply line) and the plurality of bit lines BL (second wirings). The power supply line VSS1 (sixth power supply line) supplies the voltage Vss (fourth voltage) to the word line WL (first wiring) corresponding to the selected memory cell MC in the reverse write operation. The transistor Tr8 (eighth transistor) is provided between the power supply line VSS1 (sixth power supply line) and the plurality of word lines WL (first wirings).

The current copy circuit 80 (first current copy circuit) copies the current flowing through the transistor Tr4 (sixth transistor) in the case where the transistor Tr1 (first transistor) and the transistor Tr18 (seventh transistor) are in the ON state and the transistor Tr11 (third transistor) and the transistor Tr8 (eighth transistor) are in the OFF state. Further, the current copy circuit 80 controls the transistor Tr2 (second transistor) based on the copied current. The current copy circuit 90 (second current copy circuit) copies the current flowing through the transistor Tr3 (fifth transistor) in the case where the transistor Tr11 (third transistor) and the transistor Tr8 (eighth transistor) are in the ON state and the transistor Tr1 (first transistor) and the transistor Tr18 (seventh transistor) are in the OFF state. Further, the current copy circuit 90 controls the transistor Tr12 (fourth transistor) based on the copied current.

The amplifier element Amp1 and the transistor Tr6 may be collectively referred to as a "first amplifier circuit." The amplifier element Amp2 and the transistor Tr16 may be collectively referred to as a "second amplifier circuit." The current mirror circuit including the transistors Tr2 and Tr7 may be referred to as a "first current mirror circuit." The current mirror circuit including the transistors Tr12 and Tr17 may be referred to as a "second current mirror circuit." The transistor Tr5 may be referred to as a "ninth transistor." The transistor Tr6 may be referred to as a "tenth transistor." The transistor Tr15 may be referred to as an "eleventh transistor." The transistor Tr16 may be referred to as a "twelfth transistor."

In this case, the configurations of FIG. 8 and FIG. 9 can be expressed as follows. The current copy circuit 80 (first current copy circuit) includes the first amplifier circuit and the first current mirror circuit. The first amplifier circuit is connected to the transistor Tr4 (sixth transistor). The first current mirror circuit is connected to the first amplifier circuit. The current copy circuit 90 (second current copy circuit) includes the second amplifier circuit and the second current mirror circuit. The second amplifier circuit is connected to the transistor Tr3 (fifth transistor). The second current mirror circuit is connected to the second amplifier circuit. The transistor Tr5 (the ninth transistor) is connected to the power supply line VUSEL2 (the second power supply line). The transistor Tr6 (tenth transistor) is provided between the transistor Tr5 (ninth transistor) and the first current mirror circuit. The transistor Tr15 (eleventh transistor) is connected to the power supply line VUSEL1 (fourth power supply line). The transistor Tr16 (twelfth transistor) is provided between the transistor Tr15 (eleventh transistor) and the second current mirror circuit.

Similarly, a gate terminal of the transistor Tr4 (sixth transistor) and a gate terminal of the transistor Tr5 (ninth transistor) are commonly controlled. A second terminal of the transistor Tr4 (sixth transistor) and a second terminal of the transistor Tr5 (ninth transistor) are connected to the power supply line VUSEL2 (second power supply line). The first terminal of the transistor Tr4 (sixth transistor) is connected to a first input terminal "+" of the amplifier element Amp1 included in the first amplifier circuit. The first terminal of the transistor Tr5 (ninth transistor) is connected to a second input terminal "−" of the amplifier element Amp1. An output terminal of the amplifier element Amp1 is connected to the gate terminal of the transistor Tr6 (tenth transistor).

Similarly, a gate terminal of the transistor Tr3 (fifth transistor) and a gate terminal of the transistor Tr15 (eleventh transistor) are commonly controlled. A second terminal of the transistor Tr3 (fifth transistor) and a second terminal of the transistor Tr15 (eleventh transistor) are connected to the power supply line VUSEL1 (fourth power supply line). The first terminal of the transistor Tr3 (fifth transistor) is connected to the first input terminal "+" of the amplifier element Amp2 included in the second amplifier circuit. The first terminal of the transistor Tr15 (eleventh transistor) is connected to the second input terminal "−" of the amplifier element Amp2. The output terminal of the amplifier element Amp2 is connected to the gate terminal of the transistor Tr16 (twelfth transistor).

The transistor Tr7 may be referred to as a "thirteenth transistor." The transistor Tr17 may be referred to as a "fourteenth transistor." In this case, the configurations of FIG. 8 and FIG. 9 can be expressed as follows. The first current mirror circuit includes the transistor Tr2 (second transistor) and the transistor Tr7 (thirteenth transistor) which share the gate terminal with each other. A first terminal of the transistor Tr2 (second transistor) and a first terminal of the transistor Tr7 (thirteenth transistor) are connected to the power supply line VHH1 (first power supply line). The gate terminal of the transistor Tr7 (thirteenth transistor) is connected to the second terminal of the transistor Tr7. The transistor Tr6 (tenth transistor) is connected to the first terminal of the transistor Tr5 (ninth transistor) and the second terminal of the transistor Tr7 (thirteenth transistor). The second current mirror circuit includes the transistor Tr12 (fourth transistor) and the transistor Tr17 (fourteenth transistor) which share the gate terminal with each other. A first terminal of the transistor Tr12 (fourth transistor) and a first terminal of the transistor Tr17 (fourteenth transistor) are connected to the power supply line VHH2 (third power supply line). The gate terminal of the transistor Tr17 (the fourteenth transistor) is connected to the second terminal of the transistor Tr17. The transistor Tr16 (twelfth transistor) is connected to the first terminal of the transistor Tr15 (eleventh transistor) and the second terminal of the transistor Tr17 (fourteenth transistor).

Although the present disclosure has been described with reference to the drawings, the present disclosure is not limited to the embodiments described above, and can be appropriately modified without departing from the spirit of the present disclosure. For example, based on the memory system of the present embodiment, additions, deletions, or design changes made by a person skilled in the art are also included in the scope of the present disclosure as long as the present disclosure is provided. Furthermore, the embodiments described above can be appropriately combined as long as there are no mutual contradictions, and technical matters common to each embodiment are included in each embodiment without explicit description.

It is to be understood that the present disclosure provides other operational effects that are different from operational effects provided by aspects of the embodiments described above, and those that are obvious from descriptions of the present specification or those that can be easily predicted by a person skilled in the art.

What is claimed is:

1. A memory system comprising:
a plurality of first wirings extending in a first direction;
a plurality of second wirings extending in a second direction intersecting the first direction;
a memory cell connected to the first wiring and the second wiring between the first wiring and the second wiring;
a first power supply line configured to supply a first voltage;
a first transistor arranged between the first power supply line and the plurality of first wirings, and configured to supply a current necessary to perform a write operation to the memory cell;
a second transistor arranged between the first power supply line and the plurality of first wirings;
a second power supply line configured to supply a second voltage to the second wiring corresponding to the memory cell unselected in the write operation; and
a first current copy circuit configured to copy a current flowing to the second power supply line from the second wiring corresponding to the memory cell unselected in the write operation, and configured to control the second transistor based on a copied current,
wherein the first transistor and the second transistor are connected in parallel between the first power supply line and the plurality of first wirings.

2. The memory system according to claim 1, wherein the memory cell is arranged in a position where the first wiring and the second wiring intersect.

3. The memory system according to claim 1, wherein the memory cell includes a variable resistance element and a switching element.

4. The memory system according to claim 3, wherein the variable resistance element is an element which is switchable between a first low resistance state and a first high resistance state.

5. The memory system according to claim 4, wherein;
the switching element is an element which is switchable between a second low resistance state and a second high resistance state in accordance with a supplied voltage,
a resistance of the second low resistance state is lower than a resistance of the first low resistance state, and
a resistance of the second high resistance state is higher than a resistance of the first high resistance state.

6. A memory system comprising:
a plurality of first wirings extending in a first direction;
a plurality of second wirings extending in a second direction intersecting the first direction;
a memory cell connected to the first wiring and the second wiring between the first wiring and the second wiring;
a first power supply line configured to supply a first voltage;
a first transistor arranged between the first power supply line and the plurality of first wirings, and configured to supply a current necessary to perform a write operation to the memory cell;
a second transistor arranged between the first power supply line and the plurality of first wirings, and connected in parallel with the first transistor;
a second power supply line configured to supply a second voltage to the second wiring corresponding to the memory cell unselected in the write operation;
a first current copy circuit configured to copy a current flowing to the second power supply line from the second wiring corresponding to the memory cell unselected in the write operation, and configured to control the second transistor based on a copied current;

a third power supply line configured to supply a third voltage to the first wiring corresponding to the memory cell unselected in the write operation;

a third transistor arranged between the third power supply line and the plurality of first wirings;

a fourth transistor arranged between the second power supply line and the plurality of second wirings; and a fourth power supply line configured to supply a fourth voltage to the second wiring corresponding to the memory cell selected in the write operation, wherein the first current copy circuit is configured to copy a current flowing to the fourth transistor, and configured to control the second transistor based on the copied current.

7. The memory system according to claim 6, wherein:

the first current copy circuit includes:

a first amplifier circuit connected to the fourth transistor, and a first current mirror circuit connected to the first amplifier circuit, and the second transistor is included in the first current mirror circuit.

8. The memory system according to claim 7, wherein:

the first current copy circuit includes:

a fifth transistor connected to the second power supply line, and a sixth transistor arranged between the fifth transistor and the first current mirror circuit, a gate terminal of the fourth transistor and a gate terminal of the fifth transistor are commonly controlled, a first terminal of the fourth transistor is connected to a first input terminal of a first amplifier element included in the first amplifier circuit, a first terminal of the fifth transistor is connected to a second input terminal of the first amplifier element, a second terminal of the fourth transistor and a second terminal of the fifth transistor are connected to the second power supply line, and an output terminal of the first amplifier element is connected to a gate terminal of the sixth transistor.

9. The memory system according to claim 8, wherein;

the first current mirror circuit includes a seventh transistor sharing a gate terminal with the second transistor, a first terminal of the second transistor and a first terminal of the seventh transistor are connected to the first power supply line, a gate terminal of the seventh transistor is connected to a second terminal of the seventh transistor, and the sixth transistor is connected to a first terminal of the fifth transistor and a second terminal of the seventh transistor.

10. A memory system comprising:

a plurality of first wirings extending in a first direction;

a plurality of second wirings extending in a second direction intersecting the first direction;

a memory cell connected to the first wiring and the second wiring between the first wiring and the second wiring;

a first power supply line configured to supply a first voltage;

a first transistor arranged between the first power supply line and the plurality of first wirings, and configured to supply a current necessary to perform a write operation to the memory cell;

a second transistor arranged between the first power supply line and the plurality of first wirings, and connected in parallel with the first transistor;

a second power supply line configured to supply a second voltage to the second wiring corresponding to the memory cell unselected in the write operation;

a first current copy circuit configured to copy a current flowing to the second power supply line from the second wiring corresponding to the memory cell unselected in the write operation, and configured to control the second transistor based on a copied current;

a third power supply line configured to supply the first voltage;

a third transistor arranged between the third power supply line and the plurality of second wirings, and configured to supply a current necessary to perform the write operation to the memory cell;

a fourth transistor arranged between the third power supply line and the plurality of second wirings, and connected in parallel with the third transistor;

a fourth power supply line configured to supply a third voltage to the first wiring corresponding to the memory cell unselected in the write operation; and a second current copy circuit configured to copy a current flowing to the fourth power supply line from the first wiring corresponding to the memory cell unselected in the write operation, and configured to control the fourth transistor based on a copied current.

11. The memory system according to claim 10, further comprising:

a fifth transistor arranged between the fourth power supply line and the plurality of first wirings;

a sixth transistor arranged between the second power supply line and the plurality of second wirings;

a fifth power supply line configured to supply a fourth voltage to the second wiring corresponding to the memory cell selected in the write operation;

a seventh transistor arranged between the fifth power supply line and the plurality of second wirings;

a sixth power supply line configured to supply the fourth voltage to the first wiring corresponding to the memory cell selected in the write operation; and an eighth transistor arranged between the sixth power supply line and the plurality of first wirings, wherein:

the first current copy circuit is configured to copy a current flowing to the sixth transistor in the case where the seventh transistor is in on state and the third transistor and the eighth transistor are in off state, and configured to control the second transistor based on a copied current, and the second current copy circuit is configured to copy a current flowing to the fifth transistor in the case where the eighth transistor is in on state and the first transistor and the seventh transistor are in off state, and configured to control the fourth transistor based on a copied current.

12. The memory system according to claim 11, wherein;

the first current copy circuit includes;

a first amplifier circuit connected to the sixth transistor, and a first current mirror circuit connected to the first amplifier circuit, the second transistor is included in the first current mirror circuit, the second current copy circuit includes:
    a second amplifier circuit connected to the fifth transistor, and
    a second current mirror circuit connected to the second amplifier circuit, and
the fourth transistor is included in the second current mirror circuit.

13. The memory system according to claim 12, wherein:
the first current copy circuit includes:
    a ninth transistor connected to the second power supply line, and
    a tenth transistor arranged between the ninth transistor and the first current mirror circuit,
the tenth transistor is included in the first amplifier circuit,
the second current copy circuit includes:
    an eleventh transistor connected to the fourth power supply line, and
    a twelfth transistor arranged between the eleventh transistor and the second current mirror circuit,
the twelfth transistor is included in the second amplifier circuit,
a gate terminal of the sixth transistor and a gate terminal of the ninth transistor are commonly controlled,
a second terminal of the sixth transistor and a second terminal of the ninth transistor are connected to the second power supply line,
a first terminal of the sixth transistor is connected to a first input terminal of a first amplifier element included in the first amplifier circuit,
a first terminal of the ninth transistor is connected to a second input terminal of the first amplifier element,
an output terminal of the first amplifier element is connected to a gate terminal of the tenth transistor,
a gate terminal of the fifth transistor and a gate terminal of the eleventh transistor are commonly controlled, a second terminal of the fifth transistor and a second terminal of the eleventh transistor are connected to the fourth power supply line,
a first terminal of the fifth transistor is connected to a first input terminal of a second amplifier element included in the second amplifier circuit,
a first terminal of the eleventh transistor is connected to a second input terminal of the second amplifier element, and
an output terminal of the second amplifier element is connected to a gate terminal of the twelfth transistor.

14. The memory system according to claim 13, wherein:
the first current mirror circuit includes a thirteenth transistor sharing a gate terminal with the second transistor,
a first terminal of the second transistor and a first terminal of the thirteenth transistor are connected to the first power supply line,
a gate terminal of the thirteenth transistor is connected to a second terminal of the thirteenth transistor,
the tenth transistor is connected to a first terminal of the ninth transistor and a second terminal of the thirteenth transistor,
the second current mirror circuit includes a fourteenth transistor sharing a gate terminal with the fourth transistor,
a first terminal of the fourth transistor and a first terminal of the fourteenth transistor are connected to the third power supply line,
a gate terminal of the fourteenth transistor is connected to a second terminal of the fourteenth transistor, and
the twelfth transistor is connected to a first terminal of the eleventh transistor and a second terminal of the fourteenth transistor.

* * * * *